(12) United States Patent
Kobayashi

(10) Patent No.: US 6,446,228 B1
(45) Date of Patent: Sep. 3, 2002

(54) SEMICONDUCTOR INTEGRATED CIRCUIT TESTING APPARATUS AND METHOD OF CONTROLLING THE SAME

(75) Inventor: Satoshi Kobayashi, Tokyo (JP)

(73) Assignee: Advantest Corporation, Tokyo (JP)

(*) Notice: Subject to any disclaimer, the term of this patent is extended or adjusted under 35 U.S.C. 154(b) by 0 days.

(21) Appl. No.: 09/371,639

(22) Filed: Aug. 11, 1999

(30) Foreign Application Priority Data

Aug. 11, 1998 (JO) .......................................... 10-227296

(51) Int. Cl.⁷ .......................... G01R 31/28; G11C 7/00; G11C 29/00
(52) U.S. Cl. ........................................ 714/724; 365/201
(58) Field of Search ................................ 714/729, 724, 714/718; 365/200, 201

(56) References Cited

U.S. PATENT DOCUMENTS

| | | | | |
|---|---|---|---|---|
| 3,723,867 A | * | 3/1973 | Canarutto | 324/523 |
| 3,848,188 A | * | 11/1974 | Ardezzone et al. | 714/744 |
| 4,075,608 A | * | 2/1978 | Koenig | 340/2.27 |
| 4,331,956 A | * | 5/1982 | Anderson | 340/2.26 |
| 4,345,251 A | * | 8/1982 | Begeman et al. | 340/2.26 |
| 4,701,134 A | * | 10/1987 | Jones | 439/43 |
| 5,025,205 A | * | 6/1991 | Mydill et al. | 324/73.1 |
| 5,371,748 A | * | 12/1994 | Saw et al. | 714/740 |
| 5,432,797 A | * | 7/1995 | Takano | 714/718 |
| 5,485,096 A | * | 1/1996 | Aksu | 324/761 |
| 5,794,175 A | * | 8/1998 | Conner | 702/118 |
| 5,926,420 A | * | 7/1999 | Kim | 365/189.02 |
| 5,987,635 A | * | 11/1999 | Kishi et al. | 714/724 |
| 6,006,350 A | * | 12/1999 | Tsujii | 714/738 |
| 6,055,657 A | * | 4/2000 | Heo et al. | 714/724 |
| 6,233,184 B1 | * | 5/2001 | Barth et al. | 365/201 |

\* cited by examiner

*Primary Examiner*—Albert Decady
*Assistant Examiner*—Joseph D. Torres
(74) *Attorney, Agent, or Firm*—David N. Lathrop; Gallagher & Lathrop

(57) ABSTRACT

There is provided an IC testing apparatus capable of testing ICs each having a memory portion and a logic portion formed together on one chip within a time duration shorter than that in the case that the ICs are tested using two IC testing apparatus. There are provided, in an IC tester 10 having a predetermined number of channels CH1 through CH512 for supplying driving signals to ICs under test, IC sockets SK1 through SK8 the number of which is the same as the number of memory portions that can be tested simultaneously by the IC tester, the number of the IC sockets being determined by the number of channels of the IC tester and the number of channels required for testing a memory portion of an IC under test, and further, a switching circuit 21 is provided between those IC sockets and the channels of the IC tester. This switching circuit 21 switches between a state in which driving signals for testing the memory portions of ICs are supplied to all of the IC sockets and a state in which driving signals for testing logic portions of ICs under test are supplied to a part of the IC sockets, and a testing is performed.

8 Claims, 8 Drawing Sheets

SEMICONDUCTOR INTEGRATED CIRCUIT TESTING APPARATUS AND METHOD OF CONTROLLING THE SAME

BACKGROUND OF THE INVENTION

1. Field of the Invention

The present invention relates to a semiconductor integrated circuit testing apparatus for testing a semiconductor integrated circuit, and more particularly, relates to a semiconductor integrated circuit testing apparatus (generally referred to as IC tester) which can be suitably used in testing a semiconductor integrated circuit having a logic portion and a memory portion formed together on one chip, and to a method of controlling the semiconductor integrated circuit testing apparatus, which defines the sequence of operations of the testing apparatus.

2. Description of the Related Art

Heretofore, a semiconductor integrated circuit (hereinafter referred to as IC) is called, in this technical field, a memory IC or a logic IC. The memory IC is one in which a memory portion is dominant therein, and the logic IC is one in which a logical circuit portion (logic portion) is dominant therein. In addition, an IC having a logic portion and a memory portion formed together on one chip (also referred to as logic/memory mixed IC) is called a systematic LSI (Systematic Large Scale Integrated Circuit) or the like, and the ICs of this type tend to increase from now on. The characteristic of a systematic LSI is that the number of pins required for a logic portion is several times or so as large as the number of pins required for a memory portion. Therefore, in the case of testing a logic portion of such a systematic LSI, the number of ICs that can be simultaneously tested (commonly called the number of ICs to be simultaneously measured or the number of parallel measurements) is limited due to the large number of pins of the IC under test.

FIG. 7 shows a connecting relationship between an IC testing apparatus and ICs under test (hereinafter, referred to as DUTs) in the case that the DUTs are ICs each having a logic portion and a memory portion formed together on one chip. There are provided in the IC testing apparatus 10 many channels (signal paths) through which driving signals (test pattern signals, address signals, control signals and the like) are supplied to the DUTs. The number of DUTs to be simultaneously tested is determined depending on the total number of channels. FIG. 7 is a block diagram showing, by way of example, a connecting state in the case of testing two DUTs (DUT 1 and DUT 2) each having 256 pins by the IC testing apparatus 10 having total of 512 channels CH1 through CH512 that are channel 1 (CH1) through channel 512 (CH512). Each of the DUT 1 and the DUT 2 is assumed to be a logic/memory mixed IC having 64 pins from pin P1 until pin P64 as the pins for testing the memory portion, and 192 pins from pin P65 until pin P256 as the pins for testing logic portion.

In this case, 64 channels 11 from channel CH1 until channel CH64 of the IC testing apparatus 10 are connected to the pins P1 through P64 of the DUT1, respectively, and the 192 channels from channel CH65 through channel CH256 of the IC testing apparatus 10 are connected to the pins P65 through P256 of the DUT1, respectively. However in this case, since the memory portion must be also operated for testing the logic portion of the DUT 1, each of 256 channels 12 from channel CH1 through channel CH512 of the IC testing apparatus 10 is connected to corresponding one of the pins P1 through P256 of the DUT1 to perform the testing. Since the connecting relationship for the DUT 2 is quite similar to the case of the DUT 1, the explanation thereof will be omitted.

In this manner, since only two DUTs can be connected to the IC testing apparatus 10 under the above conditions, as shown in FIG. 7, two DUTs, namely, DUT 1 and DUT 2 are connected to the IC testing apparatus 10, and the logic portion and the memory portion of each of the DUT 1 and the DUT 2 are tested to determine whether they have any defect or not.

Incidentally, although the required number of pins of the memory portion is less than that of the logic portion, there is a characteristic that a time duration or length Mt required for testing the memory portion is longer than a time duration or length Lt required for testing the logic portion. For example, in the case of the DUTs 1 and 2 shown in FIG. 7, Mt is 60 seconds, while Lt is approximately 5 seconds or so. Therefore, in this case, it takes approximately 65 seconds for testing both of the logic portion and the memory portion. For example, in the case of testing 1000 DUTs of this type, the required time length for the testing is, as two DUTs can be connected to the IC tester 10 at the same time, $(60+5) \times 1000 \times 256/512 = 65 \times 1000 \times 1/2 = 32500$ seconds $\approx 9$ hours.

This value of 9 hours is a time length required for the test only, and in reality, there is necessary, in addition to the test, a sorting process for sorting the tested ICs into non-defective articles and defective articles is necessary. Therefore, the time length required for the sorting process must be added. Consequently, a longer test time is actually required. Further, assuming that the number of channels to be used for testing the logic portion of a DUT is Lch, and the total number of channels of the IC tester 10 is Tch, "256/512" in the above calculating formula corresponds to Lch/Tch. This is equal to the reciprocal of the number of DUTs that can be tested simultaneously.

As mentioned above, when ICs of mixed logic/memory are tested by one IC testing apparatus, there is a problem that the time length required for testing the ICs becomes long. For this reason, there may be employed a case that two IC testing apparatus are provided for testing the memory portions of the ICs of mixed logic/memory using one of the two IC testing apparatus, and for testing the logic portions of the ICs of mixed logic/memory using the other one of the two IC testing apparatus.

FIG. 8 shows a connecting relationship between an IC testing apparatus 10 and DUTs in the case that the only memory portions of the logic/memory mixed ICs are tested by the IC testing apparatus 10 shown in FIG. 7. In the case of testing the memory portions of the DUTs, it is sufficient that the IC testing apparatus 10 supplies the driving signals only to the pins for the memory portion of each DUT. As already explained with reference to FIG. 7, the total number of channels Tch of the IC testing apparatus 10 is 512, and the number of pins required for the memory portion of each DUT is 64 pins from P1 to P64. Therefore, 512/64=8 DUTs (DUT1, DUT2, DUT3, . . . , DUT8) can be connected to the IC testing apparatus 10. Consequently, the number of DUTs that can be connected to one IC testing apparatus is remarkably increased.

In this manner, in the case of testing the memory portion, the number of DUTs that can be simultaneously tested is eight.

Therefore, the time length required for testing, for example, 1000 DUTs is $60 \times 1000 \times 64/512 = 7500$ seconds. In this case, assuming that the number of channels to be used for testing the memory portion of a DUT is Mch, "64/512"

corresponds to Mch/Tch. This is equivalent to the reciprocal of the number of DUTs that can be simultaneously tested.

When the logic portions of the 1000 DUTs are tested by the other one of the two IC testing apparatus (the connecting relationship is the same as that shown in FIG. 7), the test time duration is 5×1000×256/512=2500 seconds. As a result, when the memory portions and the logic portions of the DUTs are separately tested by two IC testing apparatus, respectively, the total time length Ttim required for the test is 7500 seconds+2500 seconds=10000 seconds. When this time length is compared with the time length (32500 seconds) required in the test by one IC testing apparatus, it is recognized that there is an advantage in the two IC testing apparatus case that the required time length can be remarkably reduced. However, in this case, also the sorting process is necessary in each of the memory portion test and the logic portion test.

Assuming that the time length required for the sorting process is, in each case of the memory portion test and the logic portion test, one second per simultaneous test, the sorting time in the memory portion test is 1000×64/512=125 seconds, and the sorting time in the logic portion test is 1000×256/512=500 seconds. Therefore, the time length required for both sorting processes is 625 seconds. Consequently, the total time length from the test start to the test end is 7500+2500+125+500=10625 seconds.

As mentioned above, in the case of testing logic/memory mixed ICs, the time duration required for the test can remarkably be reduced if two IC testing apparatus be used. However, in this case, since two very expensive IC testing apparatus must be provided, there is a serious problem that an economic burden to a user is very much increased. As a result, there is a drawback in the case of using two IC testing apparatus that the cost required for testing logic/memory mixed ICs is considerably increased.

SUMMARY OF THE INVENTION

It is an object of the present invention to provide an IC testing apparatus that can reduce the time duration required for a testing, even if ICs under test are ones each having a logic portion and a memory portion formed together on one chip.

It is another object of the present invention to provide an IC testing apparatus that can efficiently test the logic portions and the memory portions of ICs each having a logic portion and a memory portion formed together, and hence can carry out a testing for the ICs of logic and memory portions within a shorter time duration than in the case of testing the same ICs using two IC testing apparatus.

In order to accomplish the above objects, in one aspect of the present invention, there is provided a semiconductor integrated circuit testing apparatus comprising: a semiconductor integrated circuit tester having a predetermined number of channels for supplying driving signals; IC sockets the number of which is the same as the number of memory portions of semiconductor integrated circuits that can be simultaneously tested by the tester, the number of IC sockets being determined depending on the number of the channels of the semiconductor integrated circuit tester and the number of channels required for testing a memory portion of a semiconductor integrated circuit to be tested; and a switching circuit connected between the IC sockets and the semiconductor integrated circuit tester, the switching circuit switching between a state in which driving signals for testing memory portions of semiconductor integrated circuits under test are supplied to all of said IC sockets and a state in which driving signals for testing a logic portion or portions of a semiconductor integrated circuit or. circuits under test are supplied to a part of said IC sockets.

In a preferred embodiment, the switching circuit includes switches the number of which is the same as the number of the channels of the semiconductor integrated circuit tester, and each of those switches is constituted by ON/OFF switches the number of which is equal to a value of quotient (integer portion thereof obtained by dividing the total number of pins of a semiconductor integrated circuit under test by the number of channels required for testing a memory portion of that semiconductor integrated circuit under test. One ends of the ON/OFF switches of each of the switches are connected in common to an associated one of the channels. In addition, the other ends of the ON/OFF switches are selectively connected to corresponding output lines.

The number of the IC sockets is equal to a value of quotient (integer portion thereof obtained by dividing the number of the channels of the semiconductor integrated circuit tester by the number of channels required for testing a memory portion of the semiconductor integrated circuit under test, and the number of semiconductor integrated circuits under test whose logic portions are tested is equal to a value of quotient (integer portion thereof) obtained by dividing the number of the channels of the semiconductor integrated circuit tester by the number of channels required for testing a logic portion of the semiconductor integrated circuit under test.

In another aspect of the present invention, there is provided a method of controlling the semiconductor integrated circuit testing apparatus described above, which comprises the steps of: (a) simultaneously testing, at a time point when a testing for logic portions of the half of semiconductor integrated circuits under test among semiconductor integrated circuits under test mounted on the IC sockets has been completed, the memory portions of all of the semiconductor integrated circuits under test;

(b) starting, at a time point when the testing for the memory portions has been completed, a testing for logic portions of the remaining half of the semiconductor integrated circuits under test among the semiconductor integrated circuits under test; (c) first exchanging, during the testing for the logic portions of the remaining half of the semiconductor integrated circuits under test, the first half of the semiconductor integrated circuits whose logic portions and memory portions have been tested for semiconductor integrated circuits to be tested next; (d) starting a testing for the logic portions of the exchanged semiconductor integrated circuits under test at a time point when the testing for the logic portions of the remaining half of the semiconductor integrated circuits under test has been completed, and secondly exchanging, during the testing for the logic portions of the exchanged semiconductor integrated circuits under test, the remaining half of the semiconductor integrated circuits under test whose logic portions and memory portions have been tested for semiconductor integrated circuits to be tested next; and (e) simultaneously testing, after the secondly exchanging step, at a time point when the testing for the logic portions of the semiconductor integrated circuits under test exchanged in the first exchanging step has been completed, the memory portions of all of the semiconductor integrated circuits under test exchanged in the first and second exchanging steps, and whereby semiconductor integrated circuits can be tested substantially with no idle time by repeating the steps (b) to (e).

According to the above controlling method, when the memory portions are tested, channels the number of which is equal to the number required for the testing of the memory portions are connected to all of the IC sockets, and the memory portions of the ICs under test mounted on all of the IC sockets are simultaneously tested by supplying the driving signals to the IC sockets.

In addition, when the logic portions are tested, channels the number of which is equal to the number required for the testing of the logic portions are connected only to a part of the IC sockets, and the logic portions of the ICs under test mounted on the part of the IC sockets are tested by supplying the driving signals thereto.

When the testing has been completed, the logic portions of the ICs under test mounted on an another part of the IC sockets are tested by supplying the driving signals to those IC sockets. By repeating those operations, the logic portions of the ICs under test mounted on all of the IC sockets are tested.

Therefore, according to the present invention, when ICs under test are mounted on all of the IC sockets the number of which is the same as the number of memory portions that can be tested simultaneously, the memory portions of all of the ICs under test can be tested simultaneously. In addition, the logic portions are tested by repeating the testing for the logic portions that can be tested simultaneously. As a result, the memory portions and the logic portions of the ICs under test can be tested within the time duration substantially equal to or shorter than that in the case that two IC testing apparatus are used for the testing of the same ICs.

DETAILED DESCRIPTION OF THE PREFERRED EMBODIMENTS

Figure 6:
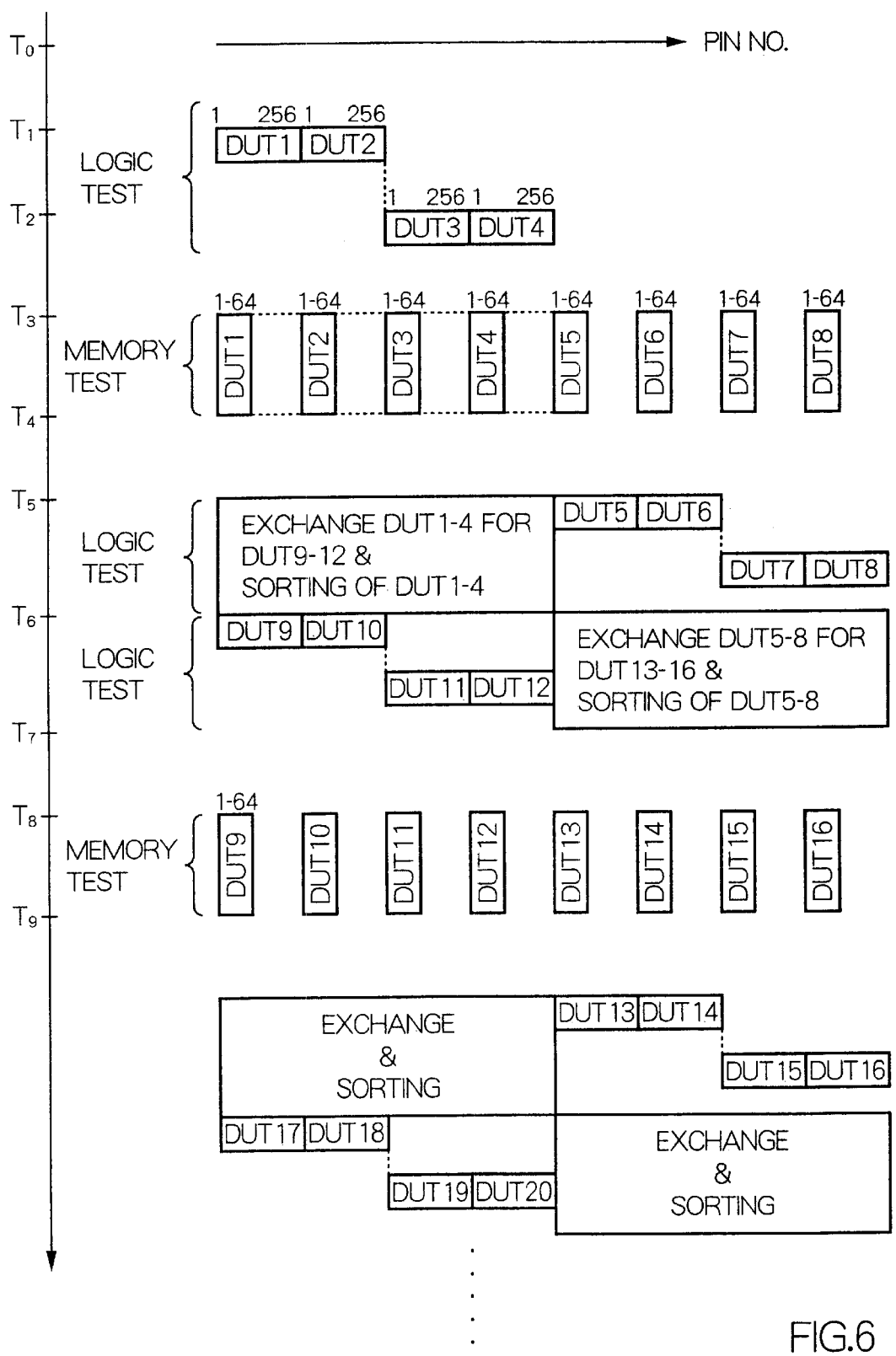
FIG. 6 is a diagram for explaining a control method of the IC testing apparatus according to the present invention.
Figure 7:
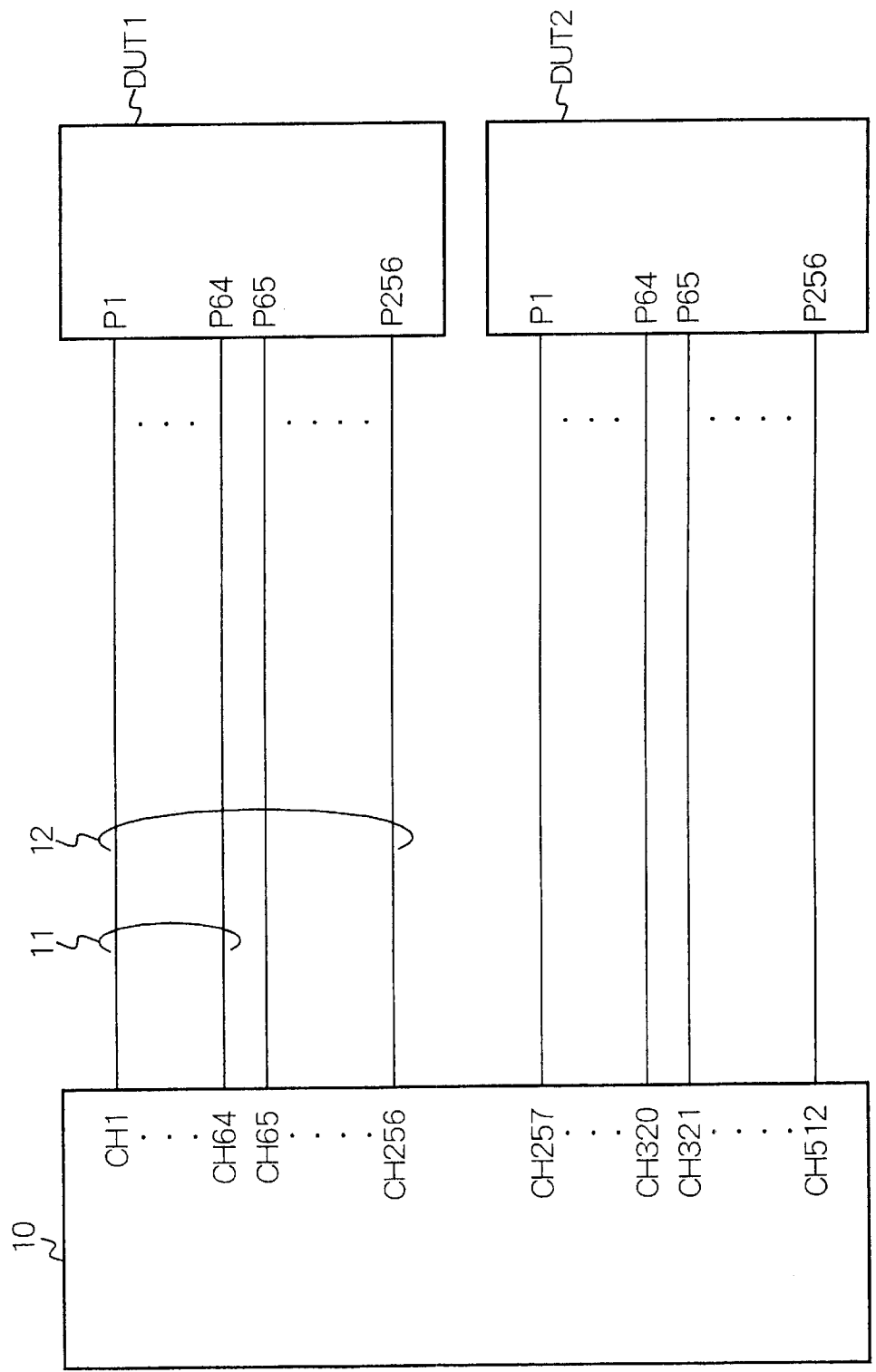
FIG. 7 is a block diagram showing a connecting state in the case of performing the test of both logic portions and memory portions of DUTs by a conventional IC testing apparatus.
Figure 8:
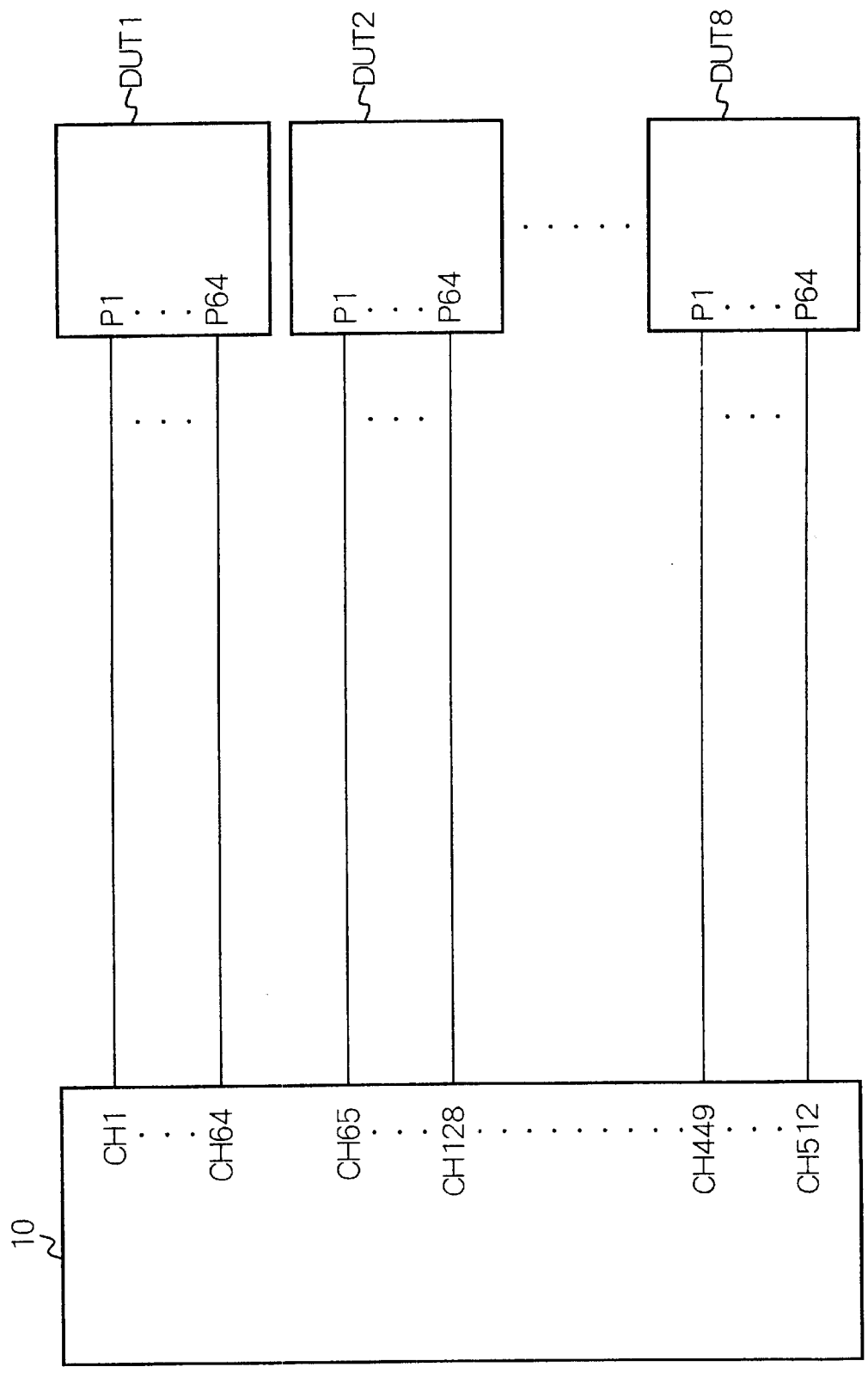
FIG. 8 is a block diagram showing a connecting state in the case of performing the test of memory portions of DUTs by the conventional IC testing apparatus.

Now, the present invention will be described regarding preferred embodiments thereof in detail with reference to FIGS. 1 to 6. Further, portions in those figures corresponding to those in FIGS. 7 and 8 are shown by having the same reference characters affixed thereto, and the explanation thereof will be omitted unless it is necessary.

Figure 1:
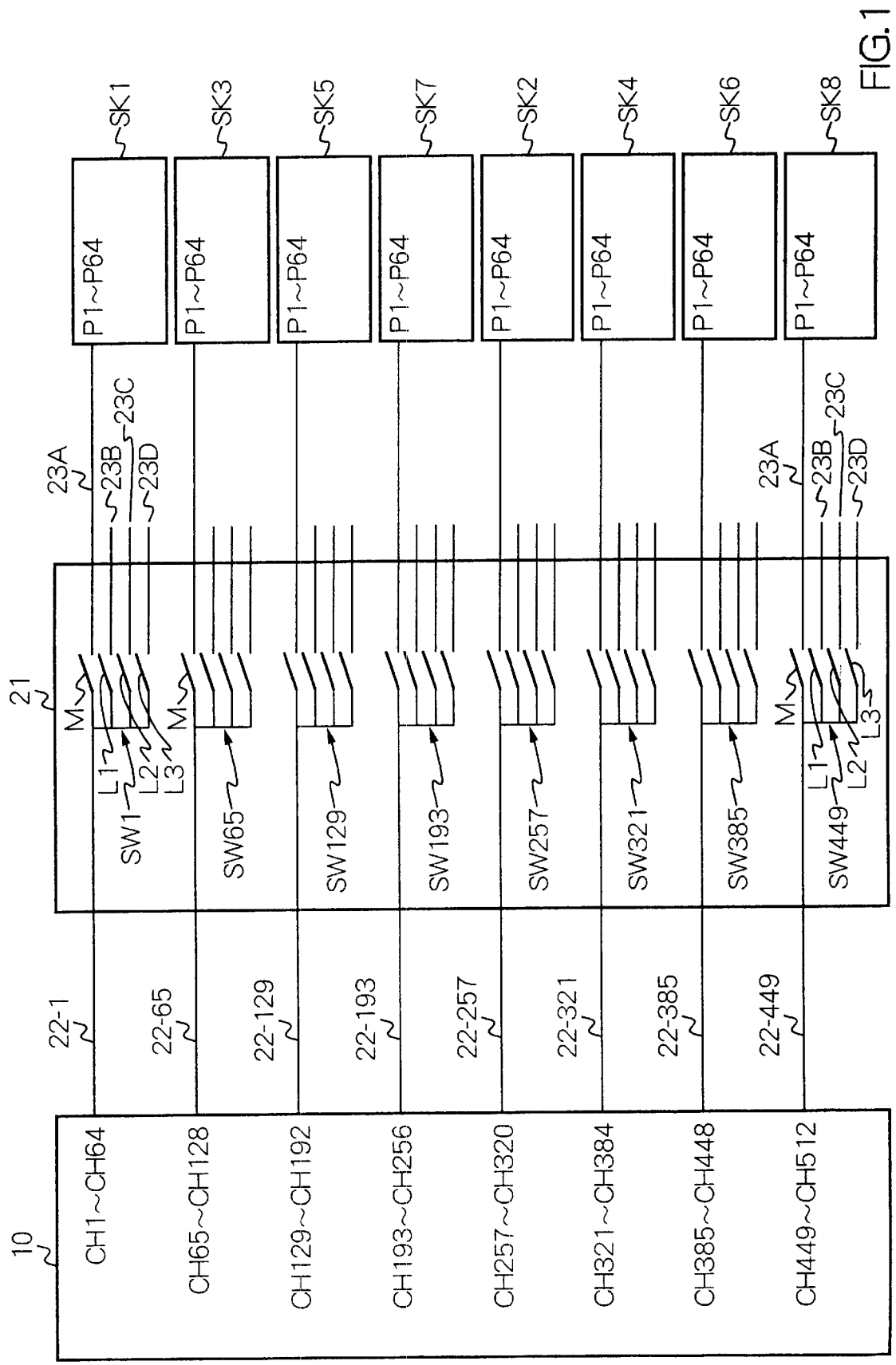
FIG. 1 is a block diagram showing an embodiment of an IC testing apparatus according to the present invention.

FIG. 1 is a block diagram showing an embodiment of the IC testing apparatus according to the present invention. The present invention is characterized in that there are provided, in an IC tester 10 having a predetermined number of channels CH1 through CH512 for supplying driving signals to DUTs, IC sockets SK1 through SK8 the number of which is the same as the number of memory portions of DUTs that can be simultaneously tested and which is determined by the number of channels of this IC tester 10 and the number of channels required for testing the memory portion of a DUT, and further, a switching circuit 21 is provided between those IC sockets SK1 through SK8 and the channels CH1 through CH512 of the IC tester 10. The DUTs are mounted on the IC sockets SK1 through SK8, respectively.

In order to make it easier to compare the present invention with the aforementioned conventional IC testing apparatus, the description will be given assuming that, also in this embodiment, the total number of channels Tch of the IC tester 10 is 512, the total number of pins of each DUT is 256, the number of channels Mch required for testing the memory portion of each DUT is 64, and the number of channels Lch required for testing the logic portion of each DUT is 256. However, it is needless to say that the total number of channels of the IC tester 10, the total number of pins of each DUT, the number of channels (or the number of pins) required for testing the memory portion of each DUT, and the number of channels (or the number of pins) required for testing the logic portion of each DUT are not limited to those numeric values.

The switching circuit 21 has switches (in this example, 512 switches SW1 through SW512) the number of which is equal to the number of channels of the IC tester 10. Each switch comprises four ON/OFF switches M, L1, L2 and L3. One end of each of these ON/OFF switches M, L1, L2 and L3 is connected in common to the output end of associated one of the channels, and the other end is selectively connected to corresponding one of output lines 23A, 23B, 28C and 23D. Further, FIG. 1 shows a state that the channels CH1 through CH64, CH65 through CH128, CH129 through CH192, CH193 through CH256, CH257 through CH320, CH321 through CH384, CH385 through CH448 and CH449 through CH512 of the IC tester 10 are connected to the switches SW1, SW65, SW129, SW193, SW257, SW321, SW385 and SW449 via one channel line 22-1, 22-65, 22-129, 22-193, 22-257, 22-321, 22-385 and 22-449, respectively. The reason for this is that all the channel lines 22-1 through 22-512 and all the switches SW1 through SW512 cannot be depicted in this drawing. In reality, the output ends of all of the channels CH1 through CHS12 are separately connected to the corresponding switches SW1 through SW512, respectively. This connecting manner is also applied to the output lines 23A, 23B, 23C and 23D.

The switching circuit 21 constructed as mentioned above performs a switching operation between the connecting state in which the memory portions of the DUTs mounted on the IC sockets SK1 through SK8 are tested and the connecting state in which the logic portions of the DUTs mounted on a part of the IC sockets (in this embodiment, two sockets) are tested. This switching operation, and connecting manners of selecting and connecting the four output lines 23A, 23B, 23C and 23D will be described later.

The number of the IC sockets is determined depending on the total number of channels Tch of the IC tester 10 and the number of channels Mch required for testing the memory portion of a DUT. In the embodiment shown in FIG. 1, the total number of channels Tch of the IC tester 10 is 512, and the number of channels Mch required for testing the memory portion of a DUT is 64. Therefore, the number of the IC sockets is 512/64=8 (SK1 through SK8). Since the total number of pins of a DUT is 256, each of the IC sockets has 256 contacts of pin numbers P1 through P256, and the terminal pins of a DUT mounted on each of the IC sockets are brought into electrical contact with the corresponding contacts of each of the IC sockets, respectively.

Each switch of the switching circuit 21 selects one of the output lines 23A, 23B, 23C and 23D by the four ON/OFF switches M, L1, L2 and L3 to connect the selected output line to the related one of the channels of the IC tester 10. Depending on which one of the output lines is connected to the channel of the IC tester 10, the connecting state can be switched from the connecting state of testing the memory portion of a DUT to the connecting state of testing the logic portion, and vice versa.

FIG. 1 shows, in order to explain the connecting state of testing the memory portion of the DUTs, the state that only the output lines 23A are connected to the contacts of the pin numbers P1 through P64 of the respective IC sockets SK1 through SK8. Specifically speaking, in FIG. 1, when the ON/OFF switches M of the 512 switches SW1 through SW512 constituting the switching circuit 21 are turned on, all of the 512 channel lines are connected to the corresponding output lines 23A, respectively. The 64 output lines 23A connected to the switches SW1 through SW64 respectively are connected to the pin numbers P1 through P64 of the IC socket SKi, respectively, the 64 output lines 23A connected to the switches SW65 through SW128 respectively are connected to the pin numbers P1 through P64 of the IC socket SK3, respectively, the 64 output lines 23A connected to the switches SW129 through SW192 respectively are connected to the pin numbers P1 through P64 of the IC socket SK5, respectively, the 64 output lines 23A connected to the switches SW193 through SW256 respectively are connected to the pin numbers P1 through P64 of the IC socket SK7, respectively, the 64 output lines 23A connected to the switches SW257 through SW320 respectively are connected to the pin numbers P1 through P64 of the IC socket SK2, respectively, the 64 output lines 23A connected to the switches SW321 through SW384 respectively are connected to the pin numbers P1 through P64 of the IC socket SK4, respectively, the 64 output lines 23A connected to the switches SW385 through SW448 respectively are connected to the pin numbers P1 through P64 of the IC socket SK6, respectively, and the 64 output lines 23A connected to the switches SW449 through SW512 respectively are connected to the pin numbers P1 through P64 of the IC socket SK8, respectively. In this manner, since the 512 output lines 23A are connected, in the unit of 64 (in the unit of the number of pins Tch required for testing the memory portion of a DUT), to the contacts of the pin numbers P1 through P64 of the corresponding IC sockets SK1 through SK8, the driving signals can be supplied from the IC tester 10 to the memory portions of the DUTs mounted on the IC sockets by turning on the ON/OFF switches M of the 512 switches SW1 through SW512. It could easily be understood that, in the illustrated embodiment, the memory portions of the eight DUTs can be tested at the same time.

Next, the connecting state of testing the logic portions of the DUTs mounted on the IC sockets SK1 through SK8 will be described with reference to FIGS. 2 to 5.

Figure 2:
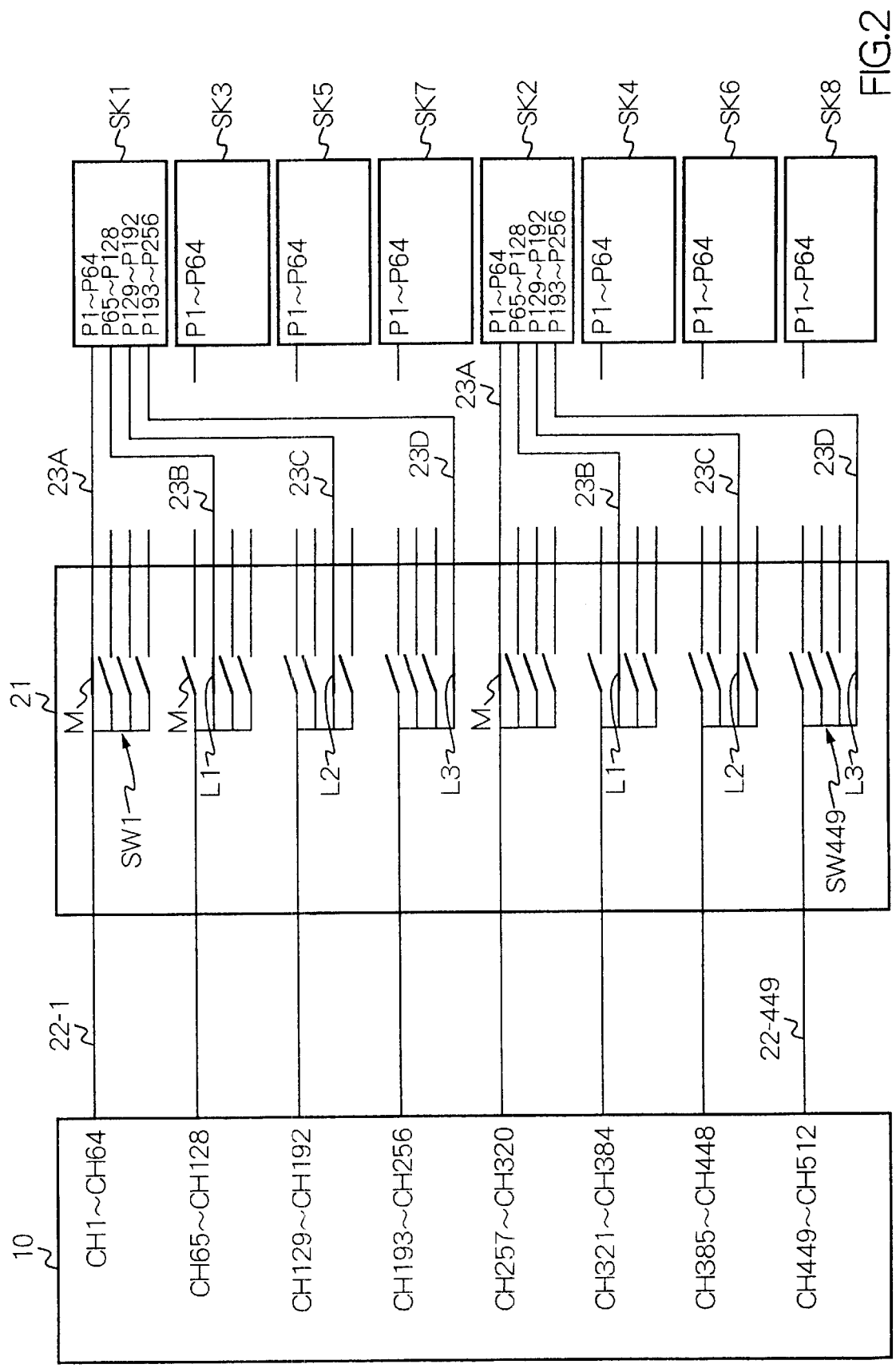
FIG. 2 is a block diagram showing a first connecting state in the case of performing the test of logic portions of DUTs by the IC testing apparatus shown in FIG. 1.

FIG. 2 shows a first connecting state in which the logic portions of the DUTs mounted on the IC sockets SK1 and SK2 are tested, In this case, (1) the ON/OFF switches M of the switches SW1 through SW64 connected to the channels CH1 through CH64, respectively, are turned on;

(2) the ON/OFF switches L1 of the switches SW65 through SW128 connected to the channels CH65 through CH128, respectively are turned on;

(3) the ON/OFF switches L2 of the switches SW129 through SW192 connected to the channels CH129 through CH192, respectively are turned on;

(4) the ON/OFF switches L3 of the switches SW193 through SW256 connected to the channels CH193 through CH256, respectively are turned on; and by the ON operations of those ON/OFF switches M, L1, L2 and L3, the output lines 23A, 23B, 23C and 23D are selected, respectively, to connect the channels CH1 through CH64, the channels CH65 through CH128, the channels CH129 through CH192 and the channels CH193 through CH256 of the IC tester 10 to the pin numbers P1 through P64, P65 through P128, P129 through P192 and P193 through P256 of the IC sockets SK1, respectively. At the same time, (5) the ON/OFF switches M of the switches SW257 through SW320 connected to the channels CH257 through CH320, respectively are turned on;

(6) the ON/OFF switches L1 of the switches SW321 through SW384 connected to the channels CH321 through CH384, respectively are turned on;

(7) the ON/OFF switches L2 of the switches SW385 through SW448 connected to the channels CH385 through CH448, respectively are turned on;

(8) the ON/OFF switches L3 of the switches SW449 through SW512 connected to the channels CH449 through CH512, respectively, are turned on; and by the ON operations of those ON/OFF switches M, L1, L2 and L3, the output lines 23A, 23B, 23C and 23D are selected, respectively, to connect the channels CH257 through CH320, the channels CH321 through CH384, the channels CH385 through CH448 and the channels CH449 through CH512 of the IC tester 10 to the pin numbers P1 through P64, P65 through P128, P129 through P192 and P193 through P256 of the IC sockets SK2, respectively.

As a result, since the driving signals for logic test can be supplied to all of the contacts of the pin numbers P1 through P256 of both IC sockets SK1 and SK2 from the corresponding channels of the IC tester 10, respectively, the logic portions of the two DUTs mounted on the IC sockets SK1 and SK2 respectively can be tested.

Figure 3:
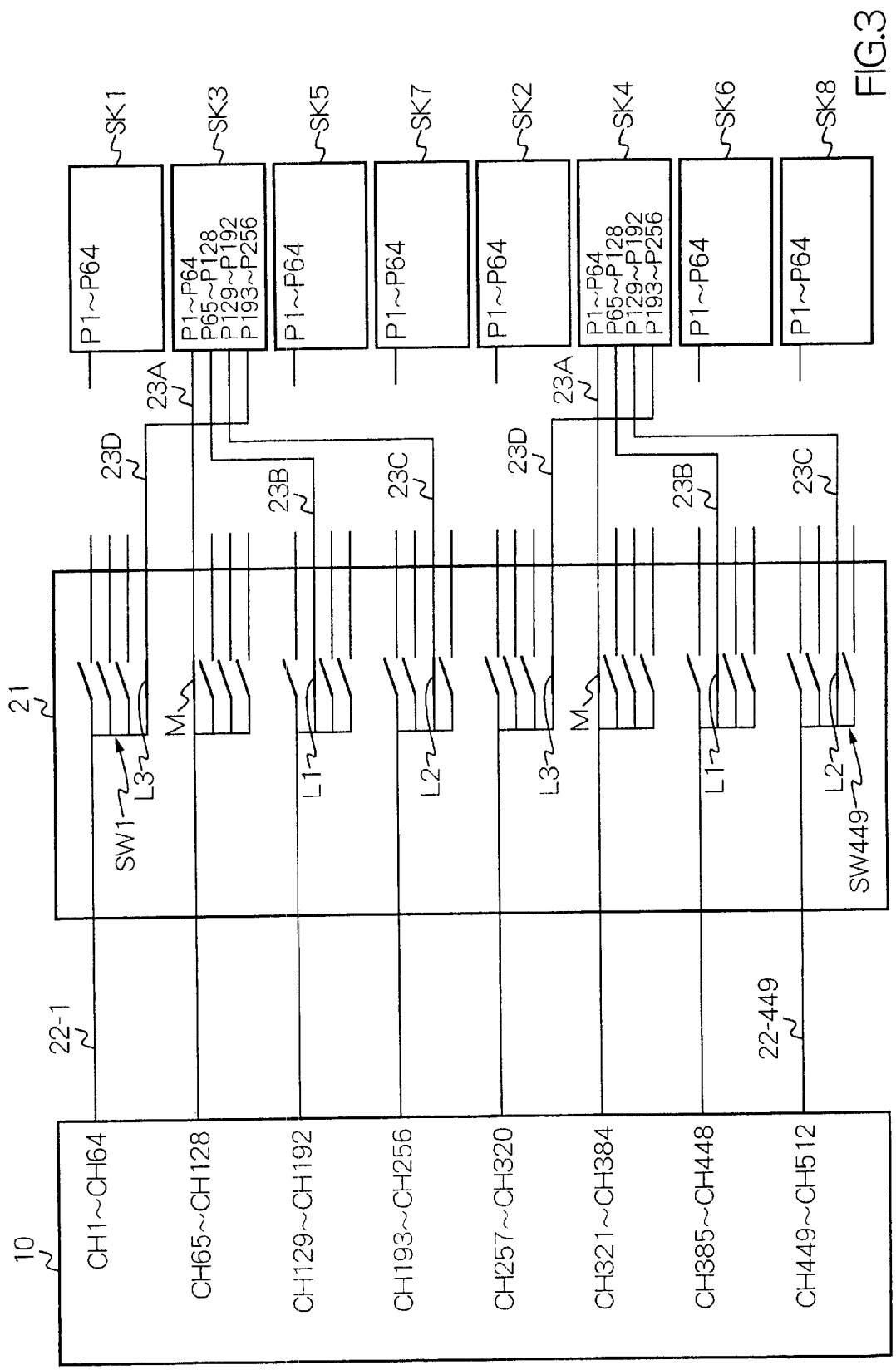
FIG. 3 is a block diagram showing a second connecting state in the case of performing the test of logic portions of DUTs by the IC testing apparatus shown in FIG. 1.

FIG. 3 shows a second connecting state in which the logic portions of the DUTs mounted on the IC sockets SK3 and SK4 are tested. In this case, (1) the ON/OFF switches L3 of the switches SW1 through SW64 connected to the channels CH1 through CH64, respectively are turned on;

(2) the ON/OFF switches M of the switches SW65 through SW128 connected to the channels CH65 through CH128, respectively are turned on;

(3) the ON/OFF switches L1 of the switches SW 129 through SW192 connected to the channels CH129 through CH192, respectively are turned on;

(4) the ON/OFF switches L2 of the switches SW193 through SW256 connected to the channels CH193 through CH256, respectively are turned on; and by the ON operations of those ON/OFf switches L3, M, L1 and L2, the output lines 23D, 23A, 23B and 23C are selected, respectively, to connect the channels CH1 through CH64, the channels CH65 through CH128, the channels CH129 through CH192 and the channels CH193 through CH256 of the IC tester 10 to the pin numbers P193 through P256, P1 through P64, P65 through P128 and P129 through P192 of the IC sockets SK3, respectively. At the same time, (5) the ON/OFF switches L3 of the switches SW257 through SW320 connected to the channels CH257 through CH320, respectively are turned on;

(6) the ON/OFF switches M of the switches SW321 through SW384 connected to the channels CH321 through CH384, respectively are turned on;

(7) the ON/OFF switches L1 of the switches SW385 through SW448 connected to the channels CH385 through CH448, respectively are turned on;

(8) the ON/OFF switches L2 of the switches SW449 through SW512 connected to the channels CH449 through CH512, respectively are turned on; and by the ON operations of those ON/OFF switches L3, M, L1 and L2, the output lines 23D, 23A, 23B and 23C are selected, respectively, to connect the channels CH257 through CH320, the channels CH321 through CH384, the channels CH385 through CH448 and the channels CH449 through CH512 of the IC tester 10 to the pin numbers P193 through P256, P1 through P64, P65 through P128 and P129 through P192 of the IC sockets SK4, respectively.

As a result, since the driving signals for logic test can be supplied to all of the contacts of the pin numbers P1 through P256 of both IC sockets SK3 and SK4 from the corresponding channels of the IC tester 10, respectively, the logic portions of the two DUTs mounted on the IC sockets SK3 and SK4 respectively can be tested.

Figure 4:
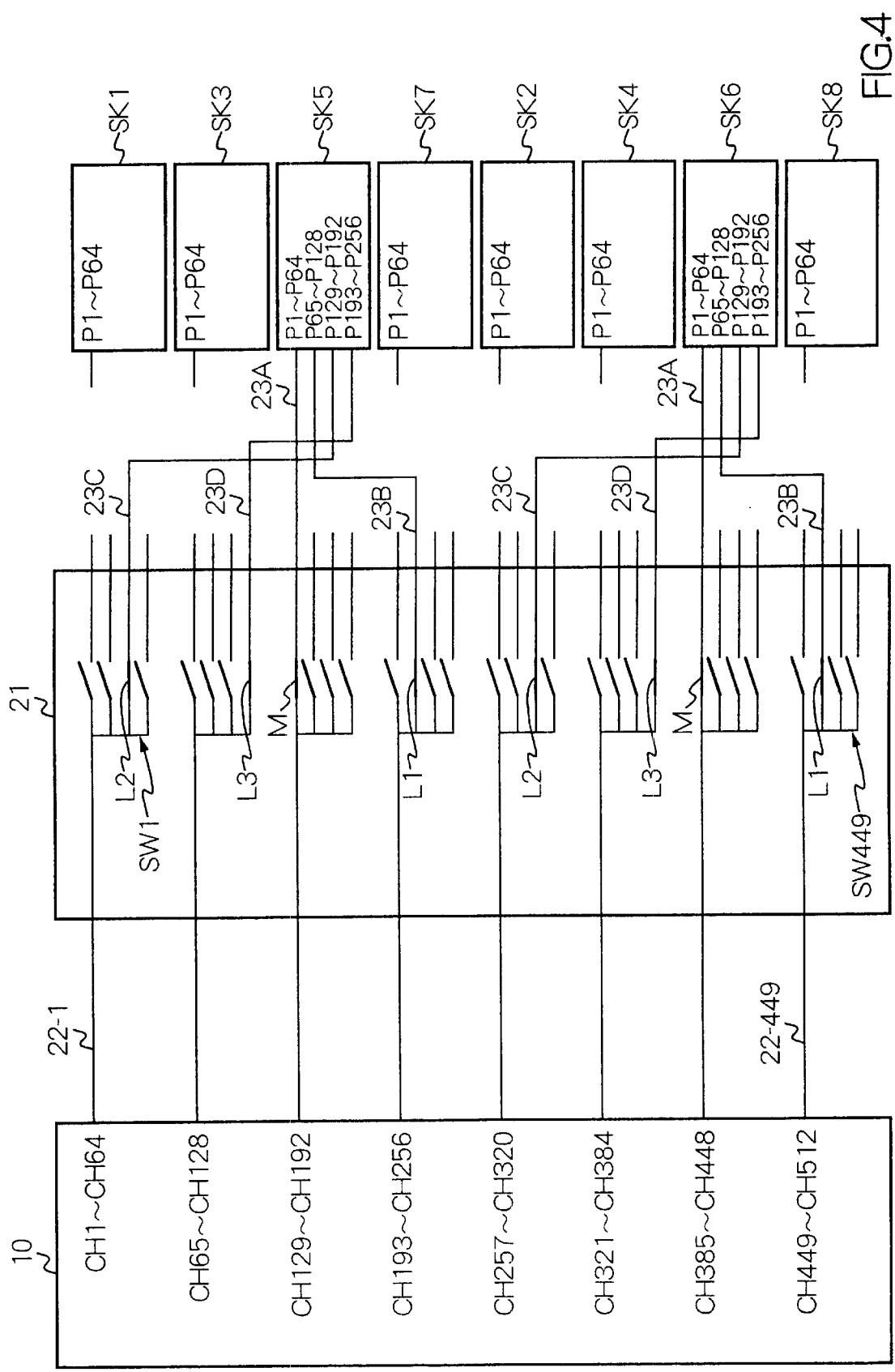
FIG. 4 is a block diagram showing a third connecting state in the case of performing the test of logic portions of DUTs by the IC testing apparatus shown in FIG. 1.

FIG. 4 shows a third connecting state in which the logic portions of the DUTs mounted on the IC sockets SK5 and SK6 are tested. In this case, (1) the ON/OFF switches L2 of the switches SW1 through SW64 connected to the channels CH1 through CH64, respectively are turned on;

(2) the ON/OFF switches L3 of the switches SW65 through SW128 connected to the channels CH65 through CH128, respectively are turned on;

(3) the ON/OFF switches M of the switches SW129 through SW192 connected to the channels CH129 through CH192, respectively are turned on;

(4) the ON/OFF switches L1 of the switches SW193 through SW256 connected to the channels CH193 through CH256, respectively are turned on; and by the ON operations of those ON/OFF switches L2, L3, M and L1, the output lines 23C, 23D, 23A and 23B are selected, respectively, to connect the channels CH1 through CH164, the. channels CH65 through CH128, the channels CH129 through CH192 and the channels CH193 through CH256 of the IC tester 10 to the pin numbers P129 through P192, P193 through P256, P1 through P64 and P65 through P128 of the IC sockets SK3, respectively. At the same time, (5) the ON/OFF switches L2 of the switches SW257 through SW320 connected to the channels CH257 through CH320, respectively are turned on;

(6) the ON/OFF switches L3 of the switches SW321 through SW384 connected to the channels CH321 through CH384, respectively are turned on;

(7) the ON/OFF switches M of the switches SW385 through SW448 connected to the channels CH385 through CH448, respectively are turned on;

(8) the ON/OFF switches L1 of the switches SW449 through SW512 connected to the channels CH449 through CH512, respectively are turned on; and by the ON operations of those ON/OFF switches L2, L3, M and L1, the output lines 23C, 23D, 23A and 23B are selected, respectively, to connect the channels CH257 through CH320, the channels CH321 through CH384, the channels CH385 through CH448 and the channels CH449 through CH512 of the IC tester 10 to the pin numbers P129 through P192, P193 through P256, P1 through P64 and P65 through P128 of the IC sockets SK6, respectively.

As a result, since the driving signals for logic test can be supplied to all of the contacts of the pin numbers P1 through P256 of both IC sockets SK5 and SK6 from the corresponding channels of the IC tester 10, respectively, the logic portions of the two DUTs mounted on the IC sockets SK5 and SK6 respectively can be tested.

Figure 5:
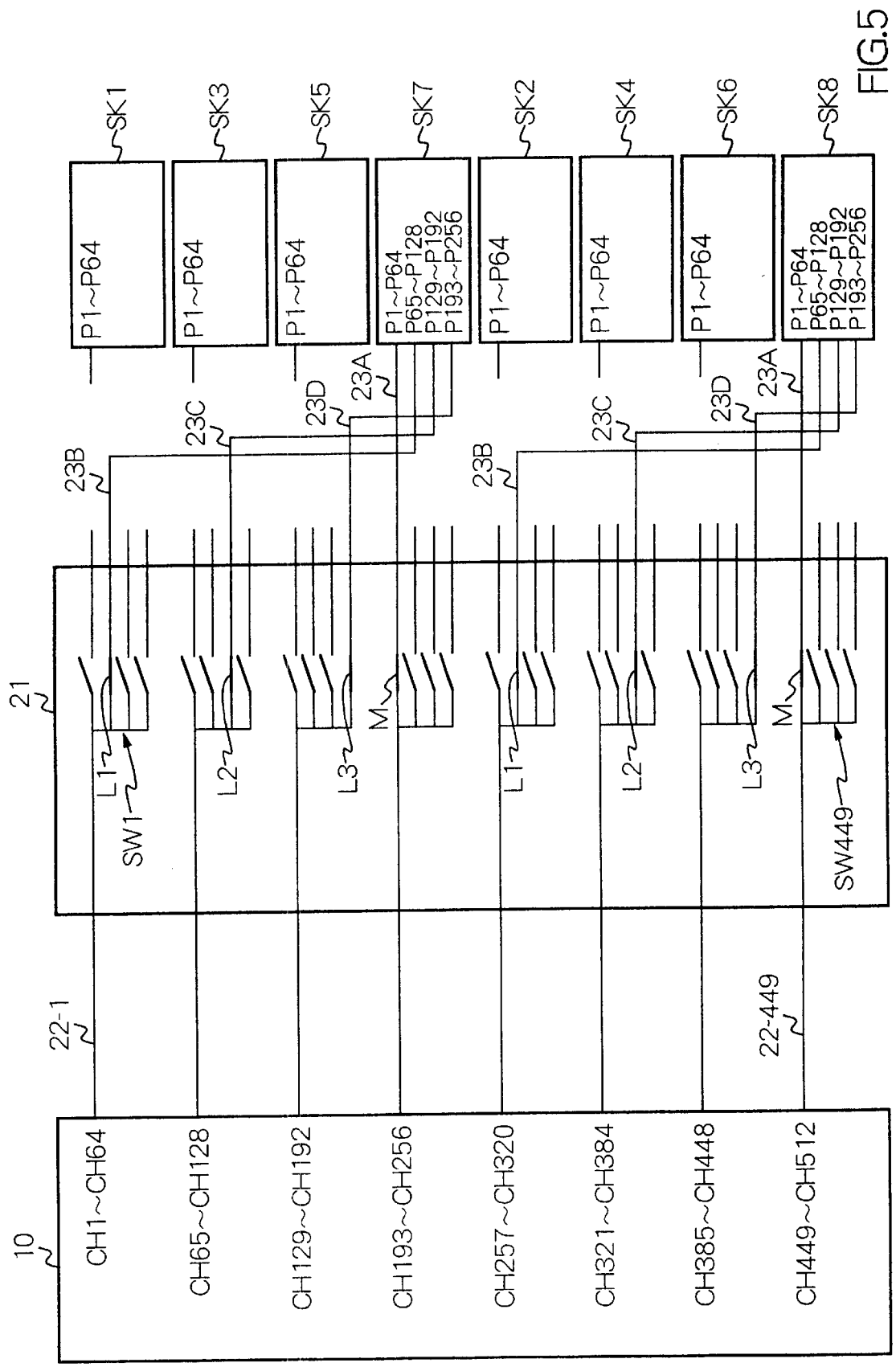
FIG. 5 is a block diagram showing a fourth connecting state in the case of performing the test of logic portions of DUTs by the IC testing apparatus shown in FIG. 1.

FIG. 5 shows a fourth connecting state in which the logic portions of the DUTs mounted on the IC sockets SK7 and SK8 are tested. In this case, (1) the ON/OFF switches L1 of the switches SW1 through SW64 connected to the channels CH1 through CH64, respectively are turned on;

(2) the ON/OFF switches L2 of the switches SW65 through SW128 connected to the channels CH65 through CH128, respectively are turned on;

(3) the ON/OFF switches L3 of the switches SW129 through SW192 connected to the channels CH129 through CH192, respectively are turned on;

(4) the ON/OFF switches M of the switches SW193 through SW256 connected to the channels CH193 through CH256, respectively are turned on; and by the ON operations of those ON/OFF switches L1, L2, L3 and M, the output lines 23B, 23C, 23D and 23A are selected, respectively, to connect the channels CH1 through CH64, the channels CH65 through CH128, the channels CH129 through CH192 and the channels CH193 through CH256 of the IC tester 10 to the pin numbers P65 through P128, P129 through P192, P193 through P256 and P1 through P64 of the IC sockets SK7, respectively. At the same time, (5) the ON/OFF switches L1 of the switches SW257 through SW320 connected to the channels CH257 through CH320, respectively are turned on;

(6) the ON/OFF switches L2 of the switches SW321 through SW384 connected to the channels CH321 through CH384, respectively are turned on;

(7) the ON/OFF switches L3 of the switches SW385 through SW448 connected to the channels CH385 through CH448, respectively are turned on;

(8) the ON/OFF switches M of the switches SW449 through SW512 connected to the channels CH449 through CH512, respectively are turned on; and by the ON operations of those ON/OFF switches L1, L2, L3 and M, the output lines 23B, 23C, 23D and 23A are selected, respectively, to connect the channels CH257 through CH320, the channels CH321 through CH384, the channels CH385 through CH448 and the CH449 through CH512 of the IC tester 10 to the pin numbers P65 through P128, P129 through P192, P193 through P256 and P1 through P64 of the IC sockets SK8, respectively.

As a result, since the driving signals for logic test can be supplied to all of the contacts of the pin numbers P1 through P256 of both IC sockets SK7 and SK8 from the corresponding channels of the IC tester 10, respectively, the logic portions of the two DUTs mounted on the IC sockets SK7 and SK8 respectively can be tested.

Thus, the test of the memory portions and the logic portions of the DUTs mounted on the eight IC sockets SK1 through SK8 have been completed.

In this manner, in the present invention, the switching circuit 21 is constituted by the switches SW1 through SW512 the number of which is the same as the number of total channels Tch (CH1 through CH512) of the IC tester 10. In addition, each of the switches is constituted by the ON/OFF switches M, L1, L2 and L3 the number of which is the same as the quotient (integer portion thereof; in this embodiment, four) obtained by dividing the total number of pins (P1 through P256) of a DUT by the number of channels Mch (number of pins P1 through P64) required for testing the memory portion of a DUT. Furthermore, those switches SW1 through SW512 are constructed such that those switches SW1 through SW512 are grouped in the unit of the number of channels Mch required for testing the memory portion of a DUT so that the same ON/OFF switches are selected for each group to be turned on. Therefore, by merely switching the four ON/OFF switches M, L1, L2 and L3 of each of the switches SW1 through SW512, the memory portions and the logic portions of the DUTs mounted on the IC sockets SK1 through SK8 can be tested in the sequential order without using two IC testing apparatus as in the conventional testing system. As a result, the sorting process can be completed by one process. Therefore, as described later, the time duration required for the entire testing can be reduced to shorter time duration than that in the case of using two IC testing apparatus.

Furthermore, as is apparent from the first through the fourth connecting states shown in FIGS. 2 to 5, respectively, one end of each of the ON/OFF switches M, L1, L2 and L3 is connected in common to the corresponding one of the channel lines, and the other ends of those ON/OFF switches are selectively connected to the corresponding output lines 23A, 23B, 23C and 23D, respectively. In addition, since only any one of the four ON/OFF switches is turned on, only selected one of the output lines connects one of the IC sockets SK1 through SK8 to the corresponding one of the channel lines via the switch turned on. The other remaining three output lines are open (non connected state). That is, the remaining three output lines are in unused state. Therefore, the switching connections between the channels of the IC tester 10 and the IC sockets SK1 through SK8 can be performed with high reliability.

Thus, according to the present invention, it could be understood that the memory portions of a predetermined number (in this embodiment, eight) of DUTs can be simultaneously tested by one IC tester 10, and the logic portions of a part (in this embodiment, two) of the predetermined number of DUTs can repeatedly be tested by the same IC tester 10.

Next, a method of controlling the IC testing apparatus according to the present invention will be described in detail with reference to FIG. 6. In FIG. 6, the longitudinal axis represents time, and the lateral axis represents the pin numbers of the IC sockets SK1 through SK8.

First of all, the DUT1 through DUT8 are mounted on the IC sockets SK1 through SK8, respectively at a time point $T_0$.

Next, the test of the logic portions (pin numbers 1 through 256) of the DUT1 and the DUT2 mounted on the IC sockets SK1 and SK2, respectively is started at a time point $T_1$.

After the completion of this test, the test of the logic portions (pin numbers 1 through 256) of the DUT3 and the DUT4 mounted on the IC sockets SK3 and SK4, respectively is started at a time point $T_2$.

At the time point when the test from the time point $T_2$ is completed, the test of the logic portions of the DUTs 1 through 4 that correspond to a half of the DUT1 through DUT8 mounted on the IC sockets SK1 through SK8, respectively is completed.

Next, the test of the memory portions (in numbers 1 through 64) of the DUT1 through DUT8 mounted on all the IC sockets SK1 through SK8, respectively is started at a time point $T_3$.

At the time point $T_4$ when the test of the memory portions is completed, the test of the memory portions and the logic portions of the DUT1 through DUT4 is completed.

Next, at a time point $T_5$, the DUT1 through DUT4 are exchanged for new DUT9 through DUT12, and the tested DUT1 through DUT4 are sorted out in accordance with the defect/non-defect determination result. The exchanging and sorting processes of the DUTs are performed by an IC transporting and processing apparatus called, in this technical field, a handler. During the exchanging and sorting process of the DUTs, the test of the logic portions (pin numbers 1 through 256) of the DUT5 and DUT6 mounted on the IC sockets SK5 and SK6, respectively is performed, and after the completion of this test of the logic portions, the test of the logic portions (pin numbers 1 through 256) of the DUT7 and DUT8 mounted on the IC sockets SK7 and SK8, respectively is performed.

At the time point when the test of the logic portions of the DUT7 and DUT8 is completed, the test of the memory portions and the logic portions of the DUT5 through DUT8 is completed. Therefore, similarly to the case of $T_5$, at the time point $T_6$, the DUT5 through DUT8 are exchanged for new DUT13 through DUT16, and the tested DUT5 through DUT8 are sorted out in accordance with the defect/non-defect determination result. During the exchanging and sorting process of the DUTs, the test of the logic portions of the DUT9 and DUT10 newly mounted on the IC sockets SK1 and SK2, respectively is started, and after the completion of this test of the logic portions, the test of the logic portions of the DUT11 and DUT12 newly mounted on the IC sockets SK3 and SK4, respectively is started.

At the time point $T_7$ when the test from the time point $T_6$ is completed, the test of the logic portions of the DUTs 9 through 12 that correspond to a half of the DUT9 through DUT16 newly mounted on the IC sockets SK1 through SK8, respectively is completed.

Next, at the time point $T_8$ when the sorting process is completed, the test of the memory portions of the DUT9 through DUT16 newly mounted on all the IC sockets SK1 through SK8, respectively is started.

At the time point $T_9$ when the test of the memory portions is completed, the test of the memory portions and the logic portions of the DUT9 through DUT12 is completed.

After this, the test of the memory portions and the logic portions, and the exchanging and sorting process are repeated in the sequence similar to that of the operations from the time point $T_5$.

By operating the IC tester 10 in accordance with the sequence shown in FIG. 6, the IC tester 10 continues to operate substantially without idle time. Therefore, the time length Ttim required for testing all the DUTs by one IC testing apparatus is expressed by the following equation.

$$Ttim = \{(Mt \times Mch/Tch) + (Lt \times Lch/Tch)\} \times N$$

Where,
Mt: a time length required for testing the memory portion of a DUT,
Lt: a time length required for testing the logic portion of a DUT, and
N: the number of DUTs to be tested.

For example, similarly to the case of the prior art system, assuming Mt=60 seconds, Lt=5 seconds, Mch=64 channels, Lch=256 channels, Tch=512 channels and N=1000 DUTs, Ttim is obtained as follows:

$$Ttim=\{(60\times64/512)+(5\times256/512)\}\times1000=(7.5+2.5)\times1000=10{,}000 \text{ seconds}$$

This time duration of 10000 seconds includes the sorting process time duration. Therefore, comparing this time duration with the time duration 10625 seconds (7500+2500+125+500) required for testing the 1000 DUTs using the two IC testing apparatus already discussed, the time duration according to the present invention is reduced from the time duration of the prior art system by the time duration required for the sorting process (625 seconds). In other words, within only the time duration required for separately testing, using two IC testing apparatus, the memory portions and the logic portions of the predetermined number of DUTs in the prior art system, one IC testing apparatus can perform, according to the present invention, the test of the memory portions and the logic portions of the same number of DUTs, and the sorting process for sorting out the tested DUTs in accordance with the test result. Therefore, according to the present invention, there is obtained a remarkable advantage that the total test time can be reduced in spite of one IC testing apparatus, compared with the case where the test is performed using two IC testing apparatus. As a result, there can be obtained an advantage that the cost required for testing ICs of mixed logic/memory can remarkably be reduced.

Further, in the aforementioned embodiments, since it is assumed that the total number of channels of the IC tester 10 is 512 and the number of channels required for testing the memory portion of a DUT is 64, the number of IC sockets is eight. In addition, since the number of channels required for testing the logic portion of a DUT is assumed to be 256, the number of DUTs whose logic portions can be tested simultaneously is limited to two. However, it could easily be understood that those numeric values are merely examples, and are not related to the essence of the invention.

It is apparent that the number of IC sockets is a value of quotient (integer portion) when the total number of channels for supplying the driving signals of the IC tester 10 is divided by the number of channels required for testing the memory portion of a DUT. In addition, it is also apparent that the number of DUTs whose logic portions are tested is a value of quotient (integer portion thereof) obtained by dividing the total number of channels of the IC tester 10 by the number of channels required for testing the logic portion of a DUT. Further, the number of ON/OFF switches constituting each of the switches SW1 through SW512 of the switching circuit 21 is a value of quotient (integer portion thereof) obtained by dividing the total number of pins of a DUT by the number of channels Mch required for testing the memory portion of a DUT.

As is apparent from the above description, according to the present invention, one IC testing apparatus can be used very efficiently. Therefore, the system according to the present invention can complete the entire test of ICs of mixed logic/memory in the time length shorter than the time length required for testing ICs of mixed logic/memory using two IC testing apparatus. As a result, it is not required to provide very expensive two IC testing apparatus. Consequently, there can be obtained a remarkable advantage that the economic burden of the user is reduced by a half, and the cost required for testing ICs of mixed logic/memory can greatly be reduced.

While the present invention has been described with regard to the preferred embodiment shown by way of example, it will be apparent to those skilled in the art that various modifications, alterations, changes, and/or minor improvements of the illustrated embodiment can be made without departing from the spirit and the scope of the present invention. Accordingly, it should be understood that the present invention is not limited to the embodiment shown and described above, and is intended to encompass such various modifications, alterations, changes, and/or minor improvements falling within the invention defined by the appended claims.

What is claimed is:

1. A semiconductor integrated circuit testing apparatus for testing a plurality of semiconductor integrated circuits each of which includes a memory portion and a logic portion, comprising:

a semiconductor integrated circuit tester having a predetermined number of channels for supplying test signals;

IC sockets the number of which is determined depending on the number of semiconductor integrated circuits that can be simultaneously tested in a memory test of the memory portion; and a switching circuit connected between said IC sockets and said semiconductor integrated circuit tester, said switching circuit switching between a first state in which memory test signals for testing the memory portions of the semiconductor integrated circuits under test are simultaneously supplied to all of said IC sockets and a second state in which logic test signals for a logic test of the memory and logic portions of the semiconductor integrated circuits under test are supplied to a part of said IC sockets and thereafter supplied to another part of said IC sockets one after another in sequence.

2. The semiconductor integrated circuit testing apparatus according to claim 1, wherein said switching circuit includes switches, a respective switch included in each of the channels of said semiconductor integrated circuit tester;

each of the switches is constituted by ON/OFF switches the number of which is equal to the integer portion of a quotient obtained by dividing the number of pins required for the logic test of a semiconductor integrated circuit under test by the number of pins required for the memory test of that semiconductor integrated circuit under test; and one ends of the ON/OFF switches of each of said switches are connected in common to an associated one of said channels.

3. The semiconductor integrated circuit testing apparatus according to claim 2, wherein the other ends of the ON/OFF switches are connected to different ones of the IC sockets such that the memory test signals are simultaneously supplied to all of the IC sockets when the switching circuit is in the first state and the logic test signals are sequentially supplied to different ones of the IC sockets when the switching circuit is in the second state.

4. The semiconductor integrated circuit testing apparatus according to claim 1, wherein the number of said IC sockets is equal to the integer portion of a quotient obtained by dividing said number of the channels of said semiconductor integrated circuit tester by the number of channels required for the memory test of the semiconductor integrated circuit under test; and the number of semiconductor integrated circuits simultaneously tested in the logic test is equal to the integer portion of a quotient obtained by dividing the number of the channels of said semiconductor integrated circuit tester by the number of channels required for the logic test of the semiconductor integrated circuit under test.

5. A method of controlling said semiconductor integrated circuit testing apparatus recited in claim 1, comprising the steps of:

(a) simultaneously testing the memory portions of all of said semiconductor integrated circuits under test when the logic test of half of semiconductor integrated circuits under test among the semiconductor integrated circuits under test mounted on said IC sockets has been completed;

(b) starting the logic test of the remaining half of the semiconductor integrated circuits under test when the memory test performed in step (a) has been completed;

(c) first exchanging, during the logic test of the remaining half of the semiconductor integrated circuits under test, the first half of the semiconductor integrated circuits whose logic test and memory test have been completed for semiconductor integrated circuits to be tested next;

(d) starting the logic test of the exchanged semiconductor integrated circuits under test when the logic test of said remaining half of the semiconductor integrated circuits under test has been completed, and secondly exchanging, during the testing the logic test of the exchanged semiconductor integrated circuits under test, said remaining half of the semiconductor integrated circuits under test whose logic test and memory test have been completed for semiconductor integrated circuits to be tested next; and (e) simultaneously testing, after said secondly exchanging step, when the logic test of the semiconductor integrated circuits under test exchanged in said first exchanging step has been completed, the memory test of all of the semiconductor integrated circuits under test exchanged in said first and second exchanging steps;

whereby semiconductor integrated circuits can be tested substantially with no idle time by repeating said steps (b) to (e).

6. The semiconductor integrated circuit testing apparatus according to claim 1, wherein the semiconductor integrated circuit tester has a predetermined number of channels for supplying logic test signals required for a logic test using the memory and logic portions; and the number of said IC sockets to which the logic test signals are supplied depend on the number of semiconductor integrated circuits that can be simultaneously tested in the logic test by the tester.

7. An apparatus for testing a plurality of semiconductor integrated circuits, each including a memory portion and a logic portion, and having pins required for a memory test that tests the memory portion and pins required for a logic test using the memory and logic portions, said pins required for the memory test being included in the pins required for the logic test, said apparatus comprising:

a semiconductor integrated circuit tester having at least one group of channels through which logic test signals required for the logic test are transmitted, said group of channels including sub-groups of channels, the number of which is equal to the number of the pins required for the memory test, and through which memory test signals required for the memory test are transmitted;

IC sockets for fitting therein semiconductor integrated circuits to be tested, the number of which is determined depending on the number of semiconductor integrated circuits that can be simultaneously tested in the memory test; and a switching circuit connected between said IC sockets and said semiconductor integrated circuit tester;

wherein each of said IC sockets has contacts coupled to the respective pins required for the logic test of the semiconductor integrated circuit under test fitted therein; and said switching circuit is switched between a first state and a second state in such a manner that, when said switching circuit is switched in the first state, respective sub-groups of channels are connected by said switching circuit to respective IC sockets such that the memory test signals required for the memory test are simultaneously supplied to contacts of the respective IC sockets coupled to the pins required for the memory test of the semiconductor integrated circuits, and when said switching circuit is switched in the second state, the group of channels is connected by said switching circuit to one of the IC sockets so that the logic test signals required for the logic test are supplied to the contacts of said one IC socket coupled to the pins required for the logic test of one semiconductor integrated circuit, and thereafter the group of channels is connected by said switching circuit to another of the IC sockets in sequence, whereby both the memory test and the logic test are performed by one testing apparatus.

8. A method of controlling a semiconductor integrated circuit testing apparatus, wherein the testing apparatus comprises:

a semiconductor integrated circuit tester having a predetermined number of channels for supplying driving signals;

IC sockets the number of which is the same as the number of memory portions of semiconductor integrated circuits that can be simultaneously tested by said tester, said number of IC sockets being determined depending on the number of the channels of said semiconductor integrated circuit tester and the number of the channels required for testing a memory portion of a semiconductor integrated circuit to be tested; and a switching circuit connected between said IC sockets and said semiconductor integrated circuit tester, said switching circuit switching between a state in which driving signals for testing memory portions of semiconductor integrated circuits under test are supplied to all of said IC sockets and a state in which driving signals for testing a logic portion or portions of a semiconductor integrated circuit or circuits under test are supplied to a part of said IC sockets;

and wherein the method comprises:

(a) simultaneously testing, at a time point when a testing for logic portions of the half of semiconductor integrated circuits under test among semiconductor integrated circuits under test mounted on said IC sockets has been completed, the memory portions of all of said semiconductor integrated circuits under test;

(b) starting, at a time point when said testing for said memory portions has been completed, a testing for logic portions of the remaining half of the semiconductor integrated circuits under test among said semiconductor integrated circuits under test;

(c) first exchanging, during the testing for the logic portions of the remaining half of the semiconductor integrated circuits under test, the first half of the semiconductor integrated circuits whose logic portions and memory portions have been tested for semiconductor integrated circuits to be tested next;

(d) starting a testing for the logic portions of the exchanged semiconductor integrated circuits under test at a time point when the testing for the logic portions of said remaining half of the semiconductor integrated circuits under test has been completed, and secondly exchanging, during the testing for the logic portions of the exchanged semiconductor integrated circuits under test, said remaining half of the semiconductor integrated circuits under test whose logic portions and memory portions have been tested for semiconductor integrated circuits to be tested next; and (e) simultaneously testing, after said secondly exchanging step, at a time point when the testing for the logic portions of the semiconductor integrated circuits under test exchanged in said first exchanging step has been completed, the memory portions of all of the semiconductor integrated circuits under test exchanged in said first and second exchanging steps;

whereby semiconductor integrated circuits can be tested substantially with no idle time by repeating said steps (b) to (e).

* * * * *